US009998125B2

(12) United States Patent
Balamurugan et al.

(10) Patent No.: US 9,998,125 B2
(45) Date of Patent: Jun. 12, 2018

(54) CLOCK CALIBRATION USING ASYNCHRONOUS DIGITAL SAMPLING

(71) Applicant: Intel Corporation, Santa Clara, CA (US)

(72) Inventors: Ganesh Balamurugan, Hillsboro, OR (US); Mozhgan Mansuri, Portland, OR (US); Sami Hyvonen, Beaverton, OR (US); Bryan K. Casper, Portland, OR (US); Frank O'Mahony, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 15/025,226

(22) PCT Filed: Nov. 19, 2013

(86) PCT No.: PCT/US2013/070824
§ 371 (c)(1),
(2) Date: Mar. 25, 2016

(87) PCT Pub. No.: WO2015/076789
PCT Pub. Date: May 28, 2015

(65) Prior Publication Data
US 2016/0241249 A1    Aug. 18, 2016

(51) Int. Cl.
*H03L 7/00* (2006.01)
*G11C 7/22* (2006.01)
(Continued)

(52) U.S. Cl.
CPC ............... *H03L 7/00* (2013.01); *G11C 7/22* (2013.01); *G11C 7/222* (2013.01); *H03K 5/1565* (2013.01);
(Continued)

(58) Field of Classification Search
CPC ........ G01R 29/02; G01R 31/26; G01R 31/28; H03K 3/017; H03K 5/156; H03K 5/1565;
(Continued)

(56) References Cited

U.S. PATENT DOCUMENTS 6,359,946 B1 *   3/2002   Ryan .................. H03L 7/00
                                                     327/141
6,694,464 B1     2/2004   Quayle et al.
(Continued)

OTHER PUBLICATIONS

International Search Report dated Sep. 18, 2014 for PCT/US2013/070824, filed Nov. 19, 2013, 2 pages.
(Continued)

*Primary Examiner* — Shawkat M Ali
(74) *Attorney, Agent, or Firm* — Womble Bond Dickinson (US) LLP

(57) ABSTRACT

Described is an apparatus which comprises: an asynchronous clock generator to generate an asynchronous clock signal; a digital sampler for sampling a signal using the asynchronous clock signal; a duty cycle corrector (DCC) to receive a differential input clock and to generate a differential output clock, wherein the digital sampler to sample at least one of an output clock from the differential output clock; and a counter to count output of the digital sampler and to provide a control to the DCC to adjust duty cycle of the differential output clock.

22 Claims, 9 Drawing Sheets

(51) Int. Cl.
*H03K 5/156* (2006.01)
*H04L 25/03* (2006.01)
*H04B 1/04* (2006.01)
*G11C 7/10* (2006.01)

(52) U.S. Cl.
CPC ............... *H04B 1/04* (2013.01); *H04L 25/03* (2013.01); *G11C 7/1066* (2013.01); *G11C 7/1093* (2013.01)

(58) Field of Classification Search
CPC ... H03K 5/04; H03K 9/08; H03L 7/00; H03L 7/06; H03L 7/07; H03L 7/08; H03L 7/087; H04B 1/04; H04B 1/40; H04B 1/50; H04L 7/00; H04L 17/01; H04L 25/03; H04L 25/49
USPC .......... 327/31, 141, 147, 156, 175; 375/219, 375/295, 316, 354, 371; 455/260; 714/725, 735, 736
See application file for complete search history.

(56) References Cited

U.S. PATENT DOCUMENTS

| | | | |
|---|---|---|---|
| 7,102,446 B1 | 9/2006 | Lee et al. | |
| 7,489,173 B1* | 2/2009 | Verma | H03K 5/1565 327/175 |
| 7,642,767 B2* | 1/2010 | Willis | G01R 29/0273 324/76.47 |
| 7,839,195 B1* | 11/2010 | Feng | H03K 5/156 327/147 |
| 8,923,462 B2* | 12/2014 | Choi | H03K 5/1565 327/175 |
| 9,116,204 B2 | 8/2015 | O'Mahony et al. | |
| 2004/0012428 A1* | 1/2004 | Yee | H03K 5/1565 327/175 |
| 2004/0161068 A1 | 8/2004 | Zerbe et al. | |
| 2005/0174156 A1 | 8/2005 | Wu et al. | |
| 2012/0099687 A1* | 4/2012 | Verhaegen | H03L 7/08 375/354 |
| 2013/0063191 A1 | 3/2013 | Patil et al. | |

OTHER PUBLICATIONS

Written Opinion of the International Searching Authority dated Sep. 18, 2014 for PCT/US2013/070824, filed Nov. 19, 2013, 5 pages.
Notification Concerning Transmittal of International Preliminary Report on Patentability issued for International Patent Application No. PCT/US2013/070824, dated Jun. 2, 2016.
European Application No. 13897939.8, European Search Report, dated May 19, 2017, 7 pgs.

* cited by examiner

CLOCK CALIBRATION USING ASYNCHRONOUS DIGITAL SAMPLING

RELATED APPLICATION

This patent application is a U.S. National Phase Application under 35 U.S.C. § 371 of International Application No. PCT/US2013/070824, filed Nov. 19, 2013, entitled CLOCK CALIBRATION USING ASYNCHRONOUS DIGITAL SAMPLING.

BACKGROUND

Accurate clock calibration is used for optimal high-speed I/O (input-output) performance. For example, clock calibration can be used for calibrating duty-cycle of a clock signal, I/Q quadrature adjustment, and clock phase calibration. Current clock quality sensors are primarily based on analog comparators and/or passive devices (e.g., capacitors, resistors, etc). These passive devices take up significant area and do not scale well over process nodes. The area overhead of analog circuits (e.g., analog comparators) and/or passive devices also limits the number and location of sensors, which limits calibration coverage.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
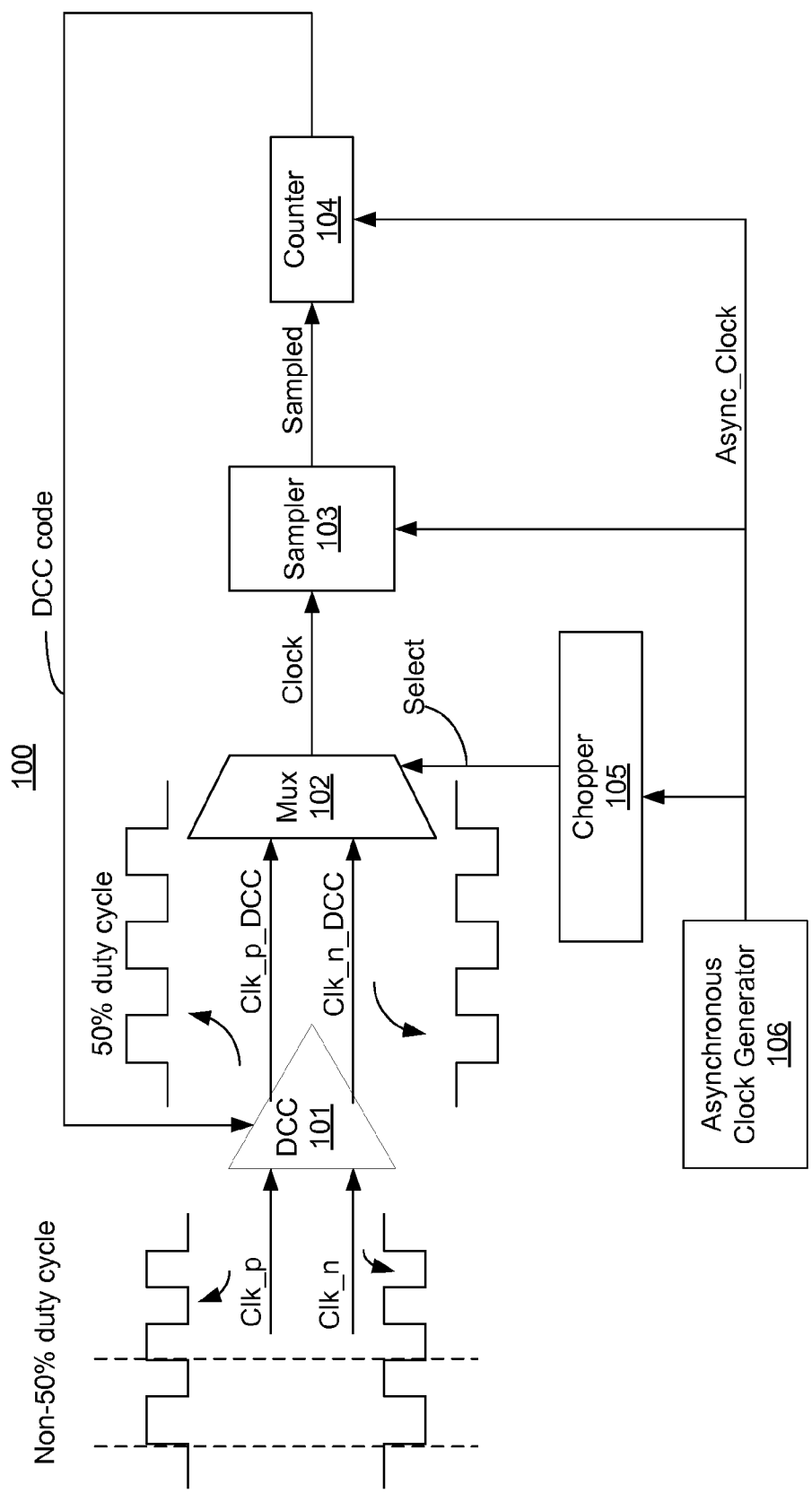
FIG. 1 illustrates a circuit for calibrating duty cycle for a clock signal using asynchronous clock, according to one embodiment of the disclosure.

The embodiments present an all-digital clock calibration apparatus and method that can be synthesized using standard cells. In one embodiment, the principle of "random equivalent time sampling" is used for calibrating a signal metric (e.g., signal duty cycle). In one embodiment, a clock signal is repeatedly sampled using an asynchronous periodic signal. In one embodiment, the sampled signal is post-processed to derive average properties of the clock signal to be calibrated. In this embodiment, the sampling density function (i.e., distribution of sampling clock edges wrapped to a clock period), approaches a uniform distribution.

There are many technical effects of the embodiments. Some non-limiting technical effects include: circuit area reduction by eliminating passives and analog comparators; better process scalability of the calibration circuit and shorter design time (e.g., can be synthesized) for that circuit; better Design-for-Test (DFT) capability by allowing integration of a greater number of sensors for calibration in a clock path without degrading clock quality; better calibration accuracy, etc. Other technical effects will be evident from various embodiments described.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a circuit 100 for calibrating duty cycle for a clock signal using asynchronous clock, according to one embodiment of the disclosure. In one embodiment, circuit 100 comprises a Duty Cycle Corrector (DCC) 101, Multiplexer (Mux) 102, Digital Sampler 103, Counter 104, Chopper 105, and Asynchronous Clock Generator 106.

In one embodiment, DCC 101 receives a differential clock Clk_p and Clk_n as inputs, where Clk_p is 180 degree out of phase relative to Clk_n. Here, labels for signals and nodes carrying those signals are interchangeably used. For example, Clk_p is used to indicate node Clk_p or signal Clk_p depending on the context of the sentence. In one embodiment, DCC 101 receives a DCC code from Counter 104 to adjust duty cycle of Clk_p_DCC and Clk_n_DCC such that the duty cycle of these signals is substantially 50%. The term "duty cycle" refers to a ratio of duration of logical high cycle to logical low cycle of a period of a signal. This ratio is expressed as a percentage. For example, a duty cycle of 50% of a signal refers to the signal having a logical low cycle which is equal in time duration as its logical high cycle.

In one embodiment, Mux 102 receives Clk_p_DCC and Clk_n_DCC signals and outputs a Clock signal according to Select signal provided by Chopper 105. In one embodiment, Clock signal is sampled by Sampler 103. In one embodiment, Sampler 103 comprises a D-Flip-Flop which is clocked using an asynchronous clock (Async_Clock) generated by Asynchronous Clock Generator 106. In other embodiments, other edge triggered sequential units may be used for Sampler 103. An embodiment of Asynchronous Clock Generator 106 is described with reference to FIGS. 4-5. Referring back to FIG. 1, in one embodiment, Async_Clock has no relationship to input clock signals Clk_p and Clk_n i.e., rising and falling edges and frequency of Async_Clock signal is not synchronized with input clock signals Clk_p and Clk_n. In one embodiment, Async_Clock is used for random sampling of Clock signal to determine DCC_code for adjusting duty cycle of Clk_p_DCC and Clk_n_DCC.

In one embodiment, Chopper 105 first causes Mux 102 to select Clk_p_DCC which is passed on as Clock signal to Sampler 103. In one embodiment, Chopper 105 is implemented using a divider (not shown) operating on Async clock. In such an embodiment, output of the divider toggles every 'N' cycles, where 'N' is the divider ratio, i.e., toggling select signal received by Mux 102. In one embodiment, on a rising (or falling) edge of Async_Clock, Sampler 103 samples Clk_p_DCC and outputs Sampled signal for Counter 104. In one embodiment, Counter 104 is a ones counter and counts up when logical level of Sampled signal (i.e., sampled version of Clk_p_DCC) is high (i.e., it counts number of logical highs). In one embodiment, Chopper 105 then (e.g., after a few cycles) causes Mux 102 to select Clk_n_DCC which is passed on as Clock signal to Sampler 103. Clk_p_DCC is an inverse of Clk_n_DCC.

There may be no dependence between the sampled values and the select signal for Mux 102. In one embodiment, Chopper 105 autonomously toggles select signal for Mux 102 every 'N' cycles regardless of the sampled values. In this embodiment, Counter 104 counts down when logical level of Sampled signal (i.e., sampled version of Clk_n_DCC) is high. In this embodiment, Counter 104 generates DCC_code which indicates how many ones were sampled using Clk_p_DCC and how many ones were sampled using Clk_n_DCC.

In one embodiment, the difference between the ratio of the counts of ones for sampled versions of Clk_p_DCC and Clk_n_DCC provides an indication of how off the duty cycle of signals Clk_p_DCC and Clk_n_DCC are from 50%, which in this example is the target duty cycle. This information in passed on in the form of DCC_code to DCC 101 so it may adjust the duty cycle of signals Clk_p_DCC and Clk_n_DCC. In one embodiment, DCC 101 receives DCC_code and adjusts the strength of transistors (not shown) in DCC 101 according to DCC_code and generates Clk_p_DCC and Clk_n_DCC signals so that they have substantially the same duty cycle e.g., 50% duty cycle.

In one embodiment, since the duty cycle of signals Clk_p_DCC and Clk_n_DCC is measured in a differential manner using just one Sampler 103, non-idealities (e.g., finite aperture, asymmetric response to rising/falling transitions, etc.) in Sampler 103 do not affect the duty cycle measurement. In this embodiment, by using asynchronous clock to sample signals Clk_p_DCC and Clk_n_DCC, sampling density function (i.e., distribution of sampling clock edges wrapped to a clock period of signals Clk_p or Clk_n) approaches a uniform distribution.

In one embodiment, Mux 102 and Sampler 103 are positioned close to DCC 101 so that they can sample Clk_p_DCC and CLk_n_DCC as close as possible from the point they are output from DCC 101. In one embodiment, other logic units i.e., Counter 104, Chopper 105, and Asynchronous Clock Generator 106 can be located at different places. For example, Counter 104, Chopper 105, and Asynchronous Clock Generator 106 can be located away from DCC 101. In this embodiment, layout constraints for proper calibration of duty cycle are reduced because most circuits can be moved away from critical path (e.g., clock distribution).

Figure 2:
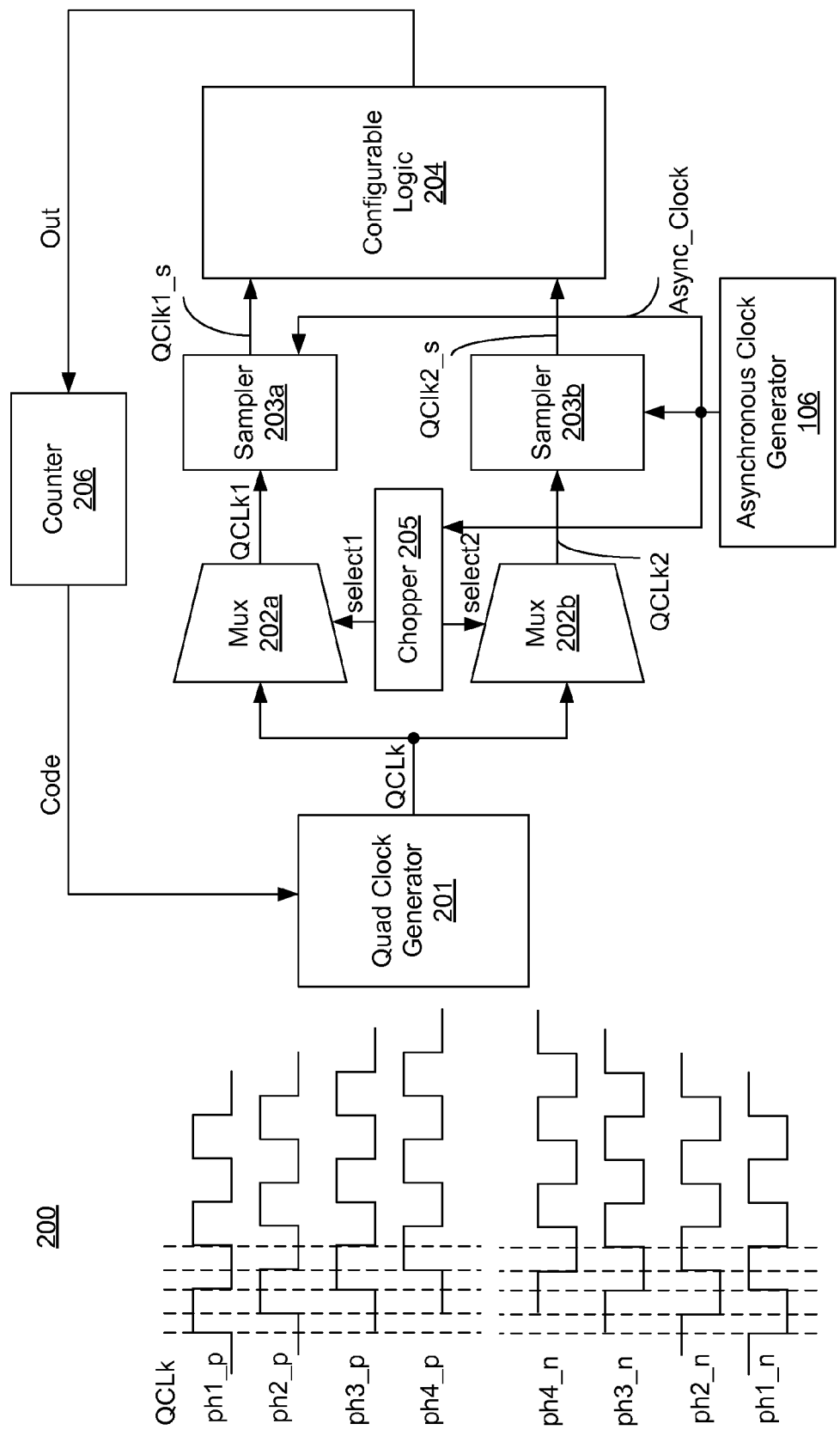
FIG. 2 illustrates a circuit for calibrating a quadrature clock signal using asynchronous clock, according to one embodiment of the disclosure.

FIG. 2 illustrates a Circuit 200 for calibrating a quadrature clock signal using asynchronous clock, according to one embodiment of the disclosure. It is pointed out that those elements of FIG. 2 having the same reference numbers (or names) as the elements of any other figure can operate or function in any manner similar to that described, but are not limited to such.

In one embodiment, Circuit 200 comprises: Quadrature (Quad) Clock Generator 201, Mux 202a, Mux 202b, Sampler 203a, Sampler 203b, Configurable Logic 204, Chopper 205, Counter 206, and Asynchronous Clock Generator 106. In one embodiment, Quad Clock Generator 201 generates a quadrature clock QClk having four clock signals (i.e., ph1_p, ph2_p, ph3_p, and ph4_p, and ph1_n, ph2_n, ph3_n, and ph4_n) each of which is to be separated by 45 degrees. Here, ph1_p is an inverse of ph1_n, ph2_p is an inverse of ph2_n, ph3_p is an inverse of ph3_n, ph4_p is an inverse of ph4_n. In one embodiment, Mux 202a and Mux 202b are 4:1 (4-to-1) multiplexers, each of which receive the four clock signals and select one of them as output for sampling by Samplers 203a and 203b.

In one embodiment, Chopper 205 generates select1 and select2 signals for Mux 202a and Mux 202b respectively. In one embodiment, Chopper 205 cycles through all clock inputs of QClk according to Async_Clock so that all phases of the four clock signals are sampled by Sampler 203a and 203b overtime. For example, Chopper 205 first selects ph1 of QClk for Mux 202a and ph2 of QClk for Mux 202b. The outputs QClk1 and QClk2 from Mux 202a and Mux 202b, respectively, are sampled by Sampler 203a and Sampler 203b, respectively.

In one embodiment, Sampler 203a and Sampler 203b are D-Flip-Flops that sample on rising (or falling) edges of Async_Clock signal to generate sampled outputs QClk1_s and QClk2_s respectively. In other embodiments, other types of edge triggered sequential units may be used for Sampler 203a and Sampler 203b. In this embodiment, the presence of two samplers—Sampler 203a and Sampler 203b—cancels any mismatch between the two samplers that may contribute to quadrature error measurement. In other embodiments, other types of samplers may be used instead of D-Flip-Flops.

In one embodiment, Configurable Logic 204 receives sampled signals QClk1_s and QClk2_s and performs a logical function between them to generate a digital signal Out which is then received by Counter 206. In one embodiment, Configurable Logic 204 includes logic to perform: AND, OR, NAND, NOR, XOR, Inversion, buffer, etc. functions between and/or for sampled signals QClk1_s and QClk2_s to generate an Out signal.

The embodiment of FIG. 2 can be used for duty-cycle detection (and correction), quadrature phase error detection (and correction), quadrature phase measurement, etc. Table 1 illustrates various calibration functions performed by Circuit 200. Examples of calibration functions include: Duty Cycle Distortion (DCD), Quadrature Error (QE), and Clock-to-Clock phase measurement.

TABLE 1

Clock Calibration Functions performed by Circuit 200

| Calibration Function | Calibration Stage | QClk1 | QClk2 | Configurable Logic |
|---|---|---|---|---|
| DCD of ph1 | Stg#1 | ph1_p | X | A |
|  | Stg#2 | ph1_n | X | (i.e., QClk1_s) |
| DCD of ph2 | Stg#1 | X | ph2_p | B |
|  | Stg#2 | X | ph2_n | (i.e., QClk2_s) |
| QE | Stg#1 | ph1_p | ph2_p | A.(not B) |
|  | Stg#2 | ph2_p | ph1_p |  |
| ph1-ph2 phase | X | ph1_p/n | ph2_p/n | A XOR B |

Table 1 illustrates five columns. The left most column is the Calibration function followed by Calibration Stage, outputs of Mux 202a and 202b i.e., QClk1 and QClk2, and logic performed by Configurable Logic 204. Here, Calibration Stage "Stg#1" refers to the first stage of a 2-stage calibration process while "Stg#2" refers to the second stage of the 2-stage calibration process; 'X' indicates "don't care"; 'A' indicates QClk1_s; and 'B' indicates QClk2_s.

In one embodiment, to measure DCD of ph1, Chopper 205 selects ph1_p for QClk1 during Stg#1 and generates sampled output 'A.' Chopper 205 then selects ph1_n for QClk1 during Stg#2 and generates sampled output 'A' again. This embodiment is similar to the embodiment of FIG. 1. In this embodiment, Calibration Logic 204 is a buffer logic which passes QClk1_s as Out. In one embodiment, Counter 206 is a ones counter and counts the number of ones (i.e., logical highs) in signal "Out" for every Async_Clock edge (rising or falling). By comparing the number of ones for sampled ph1_p and ph1_n, a determination is made about the duty cycle of ph1. In one embodiment, Counter 206 generates Code signal which is used to adjust duty-cycle of ph1 (i.e., ph1_p and ph1_n) so that it has 50% duty cycle, which is the target duty cycle in this example. In one embodiment, duty cycle of ph1 is adjusted by Quad Clock Generator 201.

In one embodiment, to measure DCD of ph2, Chopper 205 selects ph2_p for QClk2 during Stg#1 and generates sampled output 'B.' Chopper 205 then selects ph2_n for QClk2 during Stg#2 and generates sampled output 'B' again. This embodiment is similar to the embodiment of FIG. 1. In this embodiment, Calibration Logic 204 is a buffer logic which passes QClk2_s as Out. In one embodiment, Counter 206 is a ones counter and counts the number of ones (i.e., logical highs) in signal Out for every Async_Clock edge (rising or falling). By comparing the number of ones for sampled ph2_p and ph2_n, a determination is made about the duty cycle of ph2. In one embodiment, Counter 206 generates Code signal which is used to adjust duty-cycle of ph2 (i.e., ph2_p and ph2_n) so that it has 50% duty cycle, which is the target duty cycle in this example. In one embodiment, duty cycle of ph2 is adjusted by Quad Clock Generator 201.

In one embodiment, to measure QE between ph1 and ph2, in Stg#1 Chopper 205 selects ph1_p for QClk1 and ph2_p for QClk2. In this embodiment, the sampled outputs 'A' and 'B' are input to Configurable Logic 204 and a logic function is performed (e.g., A.(not B)). In one embodiment, the output of the logic function is the "Out" signal which is received by Counter 206. In one embodiment, Counter 206 counts a number of ones in "Out" signal for every Async_Clock edge (rising or falling). In one embodiment, in Stg#2 Chopper 205 then selects ph2_p for QClk1 and ph1_n for QClk2. In this embodiment, the sampled outputs 'A' and 'B' are input to Configurable Logic 204 and a logic function is performed (i.e., A.(not B)).

In one embodiment, the output of the logic function is the "Out" signal which is received by Counter 206. In one embodiment, Counter 206 counts a number of ones in "Out" signal for every Async_Clock edge (rising or falling). In one embodiment, quadrature error is measured by comparing the ones ratio of measurements in Stg#1 and Stg#2. In one embodiment, Counter 206 generates Code signal which is used to adjust phase error of ph1 (i.e., ph1_p and ph1_n) relative to ph2 so that ph1 and ph2 are separated by 45 degrees. In one embodiment, phase error of ph1 and ph2 is adjusted by phase adjustment circuitry (not shown) in Quad Clock Generator 201.

In one embodiment, phase measurement between ph1 and ph2 is performed. In this embodiment, Chopper 205 selects ph1_p and then ph1_n for QClk1. In this embodiment, Chopper 205 selects ph2_p and then ph2_n for QClk2. In one embodiment, sampled outputs A and B are received by Configurable Logic 204 which performs the logic function of A XOR B to generate "Out." In one embodiment, Counter 206 counts the number of ones in signal "Out." In one embodiment, the ratio of the count indicates phase difference between Clk1 and Clk2.

In the embodiment of FIG. 2, by configuring multiplexers 202a and 202b, and the logic following samplers 203a and 203b, a variety of clock calibration functions can be accomplished using a single circuit 200.

Figure 3:
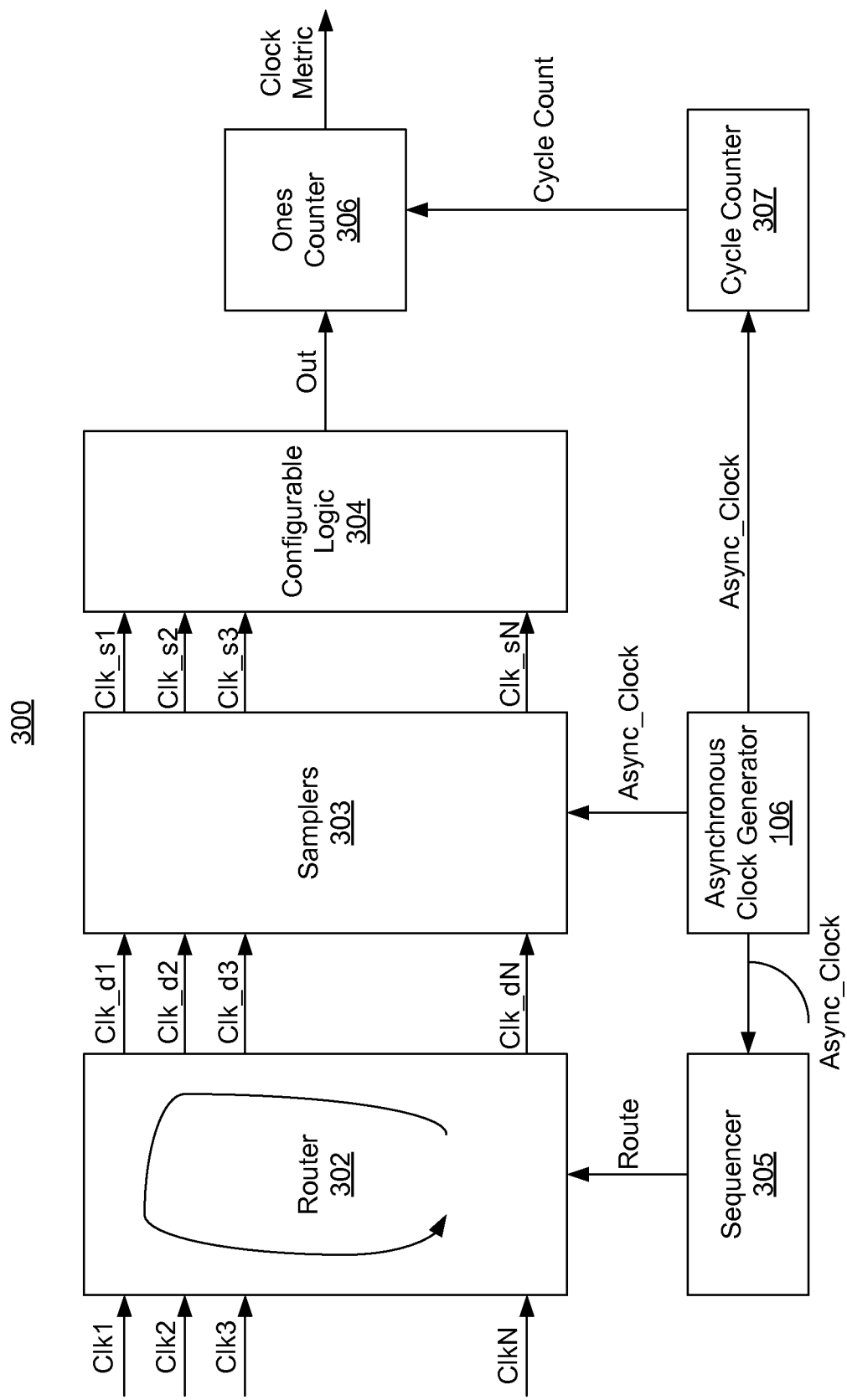
FIG. 3 illustrates a circuit model for calibrating a clock metric, according to one embodiment of the disclosure.

FIG. 3 illustrates a Circuit 300 for calibrating a clock metric, according to one embodiment of the disclosure. It is pointed out that those elements of FIG. 3 having the same reference numbers (or names) as the elements of any other figure can operate or function in any manner similar to that described, but are not limited to such.

In one embodiment, Circuit 300 is a multi-purpose circuit for calibrating a clock metric. In one embodiment, Circuit 300 comprises Router 302, Samplers 303, Configurable Logic 304, Sequencer 305, Ones Counter 306, Cycle Counter 307, and Asynchronous Clock Generator 106. So as not to obscure the embodiments, logic units having similar function as logic units discussed above are not discussed in detail again.

In one embodiment, Router 302 receives a number of clock signals Clk1-ClkN, where 'N' is an integer greater than one. In one embodiment, Router 302 cycles through the inputs Clk1-ClkN to provide outputs Clk_d1-Clk_dN, where 'N' is an integer greater than one. Here, Router 302 performs a function similar to Mux 102 of FIG. 1 and Mux 202a and Mux 202b of FIG. 2. In one embodiment, Router 302 cycles through inputs Clk1-ClkN or selects various combinations of inputs Clk1-ClkN using Route signal provided by Sequencer 305. Here, Sequencer 305 performs a function similar to Chopper 105 of FIG. 1 and Chopper 205 of FIG. 2. In one embodiment, Sequencer 305 is a finite state machine (FSM) which operates using Async_Clock.

In one embodiment, Sampler 303 is a number of samplers to sample inputs Clk_d1-Clk_dN and to generate sampled outputs Clk_s1-Clk_sN. In one embodiment, Sampler 303 includes a number of D-Flip-Flops which are clocked using Async_Clock. In one embodiment, the sampled output Clk_s1-Clk_sN is received by Configurable Logic 304. In one embodiment, Configurable Logic 304 performs many logic functions.

For example, Configurable Logic 304 can perform the functions of Configurable Logic 204 of FIG. 2. In one embodiment, Circuit 300 includes a Ones Counter 306 to count the number of ones in signal "Out." In one embodiment, Circuit 300 includes a Cycle Counter 307. In one embodiment, Cycle Counter 307 counts the number of clock cycles (i.e., Cycle Count) over which the measurement is made. In one embodiment, the ones count ratio is then obtained by dividing the value from Ones Counter 306 by the value of Cycle Count.

In one embodiment, Samplers 303, Sequencer 305, Ones Counter 306, and Cycle Counter 307 are clocked using Async Clock. In one embodiment, output of Ones Counter 306 is the Clock Metric (e.g., code) indicating a property of Clk1-ClkN. In one embodiment, Clock Metric is received by a logic unit (not shown) to adjust one or more properties of Clk1-ClkN. For example, the logic unit may be a DCC (e.g., DCC 101) and the property to be adjusted is the duty cycle of Clk1-ClkN to achieve 50% duty cycle for the clock signals Clk_d1-Clk_dN.

Figure 4:
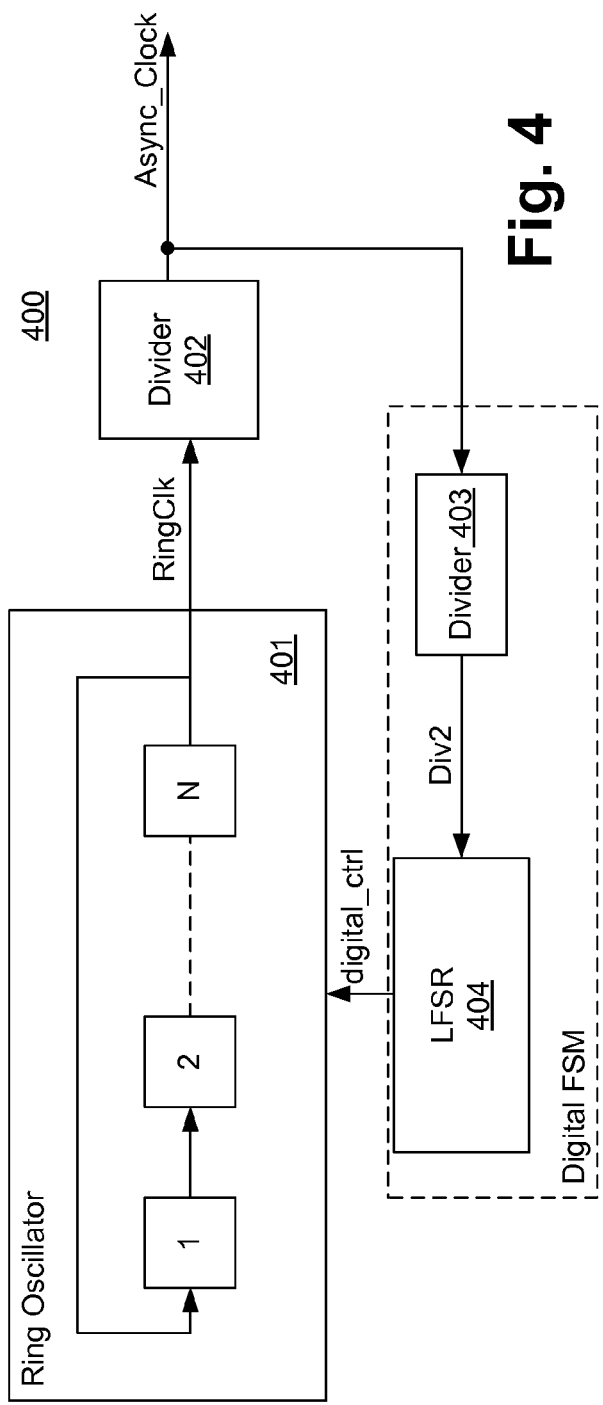
FIG. 4 illustrates an asynchronous clock generator, according to one embodiment of the disclosure.

FIG. 4 illustrates an Asynchronous Clock Generator 400, according to one embodiment of the disclosure. It is pointed out that those elements of FIG. 4 having the same reference numbers (or names) as the elements of any other figure can operate or function in any manner similar to that described, but are not limited to such.

In one embodiment, Asynchronous Clock Generator 400 comprises Ring Oscillator 401, First Divider 402 and Digital FSM (finite state machine) having Second Divider 403 and Linear Feedback Shift Register (LFSR) 404. In one embodiment, Ring Oscillator 401 comprises a number of digital cells 1-N coupled together in a ring, where 'N' is an integer greater than one. In one embodiment, Digital FSM provides a digital_ctrl (i.e., digital control) signal to adjust the delay of each of the delay cells 1-N. In one embodiment, each of the delay cells 1-N is a complex gate.

Figure 5:
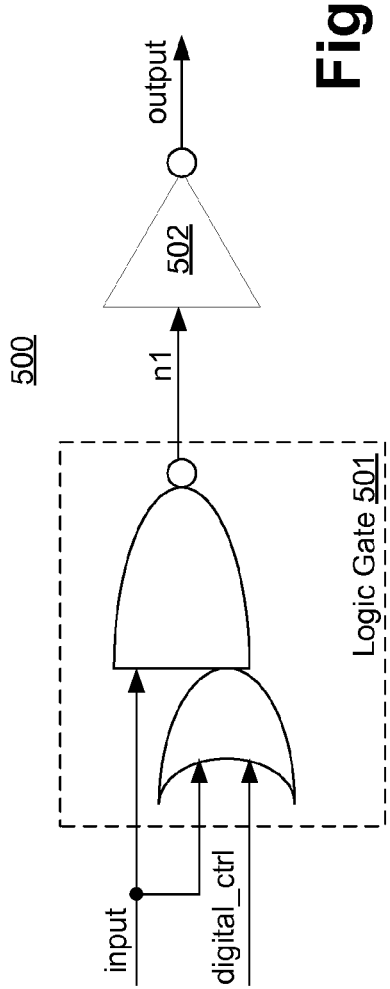
FIG. 5 illustrates a delay cell of a ring oscillator used by the asynchronous clock generator, according to one embodiment of the disclosure.

FIG. 5 illustrates a delay cell 500 (e.g., one of delay cells 1-N) of Ring Oscillator 401 used by the asynchronous clock generator, according to one embodiment of the disclosure. It is pointed out that those elements of FIG. 5 having the same reference numbers (or names) as the elements of any other figure can operate or function in any manner similar to that described, but are not limited to such.

In one embodiment, delay cell 500 comprises logic gate 501 and inverter 502. In one embodiment, logic gate 501 comprises a NAND gate coupled to an OR gate to form a complex gate. In this embodiment, logic gate 501 receives input (which is input of the delay cell 500) and digital_ctrl to generate output "n1" for inverter 502. In one embodiment, inverter 502 provides the output of delay cell 500. In one embodiment, logic gate 501 is a complex gate which enables delay modulation without modifying the input-output logic function.

Referring back to FIG. 4, in one embodiment, output RingClk of Ring Oscillator 401 is received by First Divider 402 (e.g., divide by $2^{0 \text{ to } 6}$) which divides the frequency of RingClk to generate Async_Clock. In one embodiment, Async_Clock is received by Second Divider 403 (e.g., divide by 64) of the Digital FSM to generate Div2 signal. In one embodiment, one or both of First and Second Dividers 402 and 403 are programmable dividers. In one embodiment, Div2 signal is then input to LFSR to generate digital_ctrl signal. In one embodiment, to reduce the probability of the Async_Clock being synchronous with the calibrated clock signal, frequency of Async_Clock is digitally modulated by a Pseudo-Random Bit Sequence (PRBS) generated by LFSR. In one embodiment, Asynchronous Clock Generator 400 is shared by several calibration circuits (e.g., Circuits 100, 200, and 300, and others) to reduce overall area.

Figure 6:
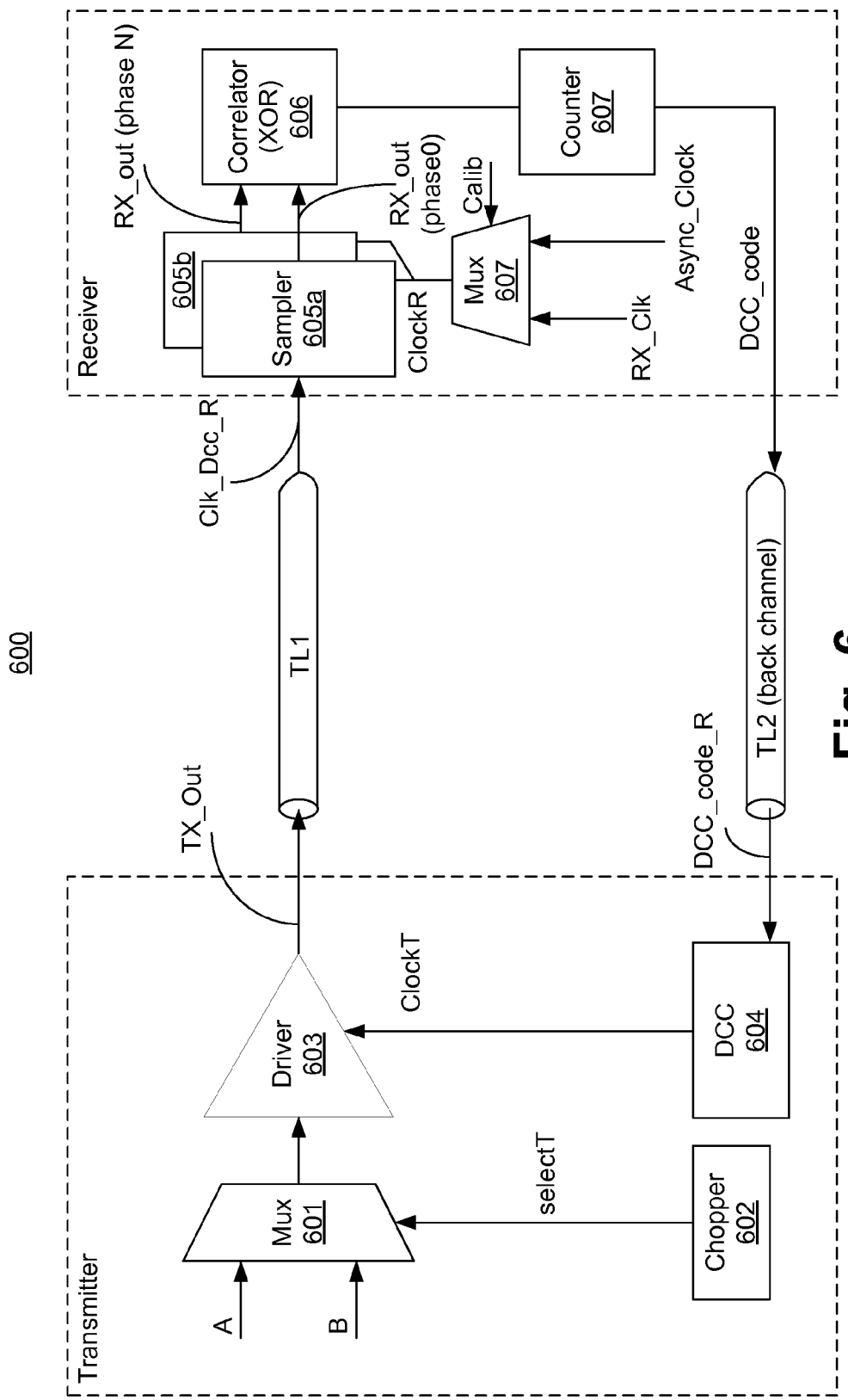
FIG. 6 illustrates a system with circuit to correct duty cycle of a transmitter clock, according to one embodiment of the disclosure.

FIG. 6 illustrates a system 600 with circuit to correct duty cycle of a transmitter clock, according to one embodiment of the disclosure. It is pointed out that those elements of FIG. 6 having the same reference numbers (or names) as the elements of any other figure can operate or function in any manner similar to that described, but are not limited to such.

Known clock calibration techniques are unable to fully calibrate clock signal in a transceiver signal path. Some reasons for such limitation in known clock calibration techniques are that it is difficult to integrate sensors in the data path without degrading signal quality; and having a replica circuit dedicated for calibration increases power and area. The embodiments extend the concept asynchronous digital sampling discussed with reference to FIGS. 1-5 to system 600.

In one embodiment, system 600 comprises a Transmitter (Tx) and Receiver (Rx) coupled together via transmission lines (TLs). In one embodiment, Transmitter comprises Mux 601, Chopper 602, Driver 603, and DCC 604. In one embodiment, Receiver comprises Samplers 605a and 605b, Correlator (i.e., XOR) 606, Counter 706, and Mux 607. In one embodiment, Driver 603 is coupled to Receiver by TL1. In one embodiment, DCC_code from Counter 607 of the Receiver is provided to DCC 604 of the Transmitter via a back channel TL2.

In one embodiment, RX_Clk in the Receiver is overridden using Mux 607 to provide Async_Clock as ClockR to the Receiver Samplers, e.g., Sampler 605a and 605b. In such an embodiment, existing Receiver samplers are reused for sampling data driven by Driver 603 of the Transmitter. In this embodiment, the sampling for calibration is performed by Async_Clock. For example, when duty-cycle of clock signal Clk_Dcc is to be corrected, then Calib signal in the Receiver causes Mux 607 to select Async_Clock as ClockR for duty cycle calibration. In one embodiment, when Clk_Dcc is calibrated to have 50% duty cycle, then Calib signal causes Mux 607 to use the Rx_Clk as ClockR for regular operation of the Receiver.

In one embodiment, Mux 601 provides one of 'A' or 'B' signals to Driver 603 to drive as Clk_Dcc. In one embodiment, Chopper 602 generates selectT signal to ping-pong between 'A' and 'B' signals to calibrate Clk_Dcc. Here, signal 'B' is an inverse of signal 'A.' The process of duty cycle correction is similar to the embodiment of FIG. 1. In one embodiment, DCC 604 provides Transmitter clock ClockT to Driver 603. In this embodiment, the samplers are at a far end (i.e., in the Receiver) compared to being close to the DCC 604. One reason for this is to incorporate the entire transmission path to correct duty cycle of Clk_Dcc.

In one embodiment, Driver 603 drives Tx_Out over TL1 to the Receiver. Tx_Out at the Receiver end is Clk_Dcc_R, which may have a distorted duty cycle because of non-idealities in the transmission path. In one embodiment, DCC 604 corrects the duty cycle error caused by the non-idealities. In one embodiment, Clk_Dcc_R is sampled by Samplers 605a and 605b which use Async_Clock to sample incoming data (i.e., Clk_Dcc_R). The sampled data Rx_Out (for phases 0-N) are then received by Correlator 606. In one embodiment, Correlator (XOR) 606 outputs a logical high when the incoming edge falls between the sampling phases of its input samplers. In one embodiment, by comparing the ones count at the outputs of the bank of 'N' Correlators 606, mismatch between various sampling phases (when there is no mismatch can be estimated i.e., when all the 'N' phases are evenly distributed, the values of the 'N' Counters 607 (i.e., Ones Counter) are nearly identical.

In one embodiment, Counter 607 counts a number of ones in the sampled output. For DCC measurement, in one embodiment, Correlator 606 is bypassed so the sampler output Rx_out feeds Counter 607 directly. In one embodiment, Correlator 606 is used only for sampling clock phase measurement. Using the data of counts when 'A' is selected and when 'B' is selected, Counter 607 generates a DCC_code. In one embodiment, this DCC_code is sent to DCC 604 via a back channel TL2. Since DCC_code is a digital code, non-idealities caused by TL2 do not impact the duty cycle of Clk_Dcc. The DCC_code at the Transmitter end is DCC_code_R. In one embodiment, Transmitter may have Circuit 100 of FIG. 1 to correct duty cycle of Clk_Dcc locally instead of using back channel TL2.

Figure 7:
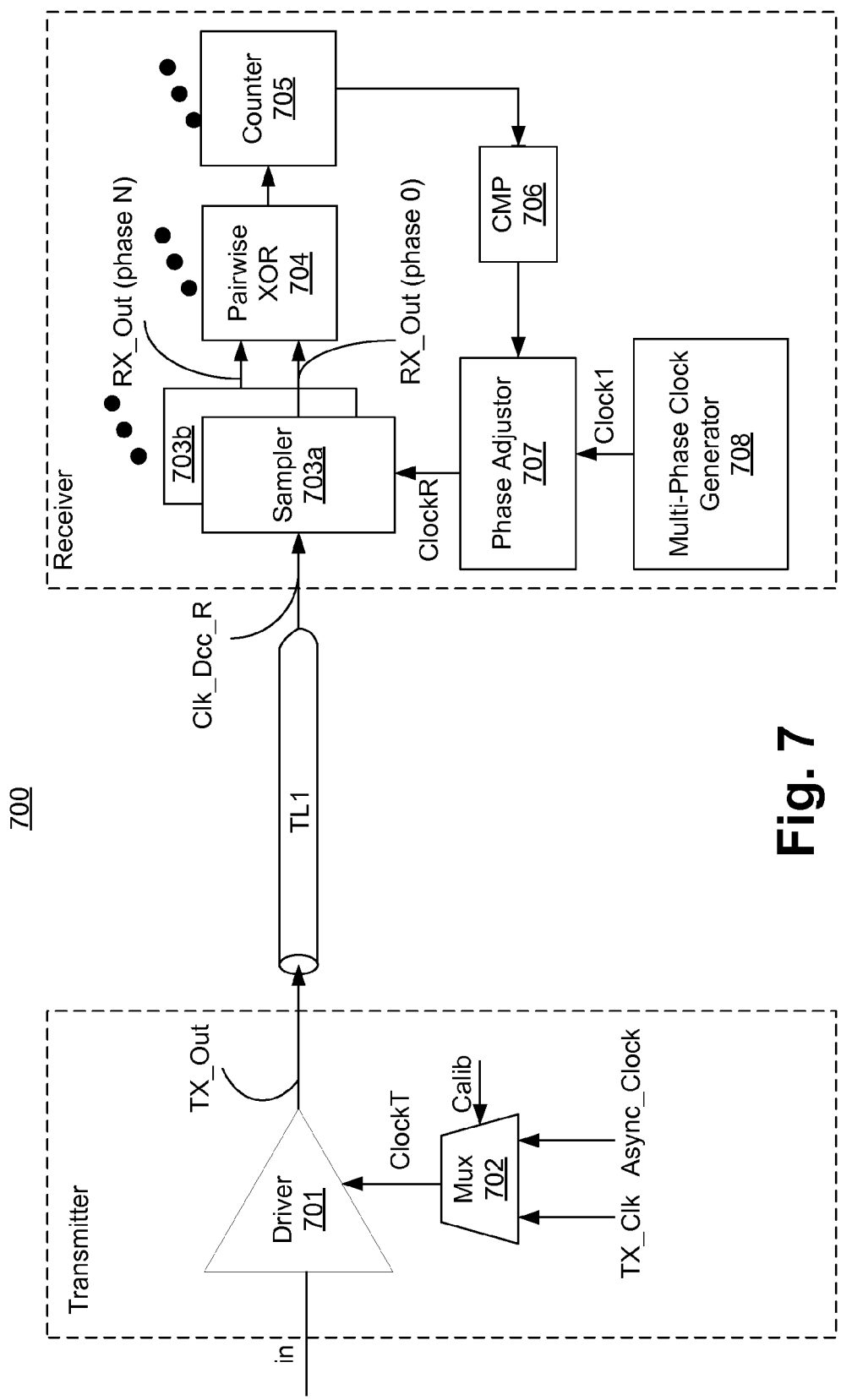
FIG. 7 illustrates a system with circuit to calibrate phase of a clock signal used by a receiver, according to one embodiment of the disclosure.

FIG. 7 illustrates a system 700 with circuit to calibrate phase of a clock signal used by a receiver, according to one embodiment of the disclosure. It is pointed out that those elements of FIG. 7 having the same reference numbers (or names) as the elements of any other figure can operate or function in any manner similar to that described, but are not limited to such.

In one embodiment, system 700 comprises a Transmitter and Receiver coupled by a transmission line TL1. In one embodiment, Transmitter comprises Driver 701 and Mux 702. In one embodiment, Receiver comprises Sampler(s) 703, Pair-Wise XOR logic gate 704, Counter 705, Compare (CMP) logic 706, Phase Adjuster 707, and Multi-Phase Clock Generator 708.

In this embodiment, transmitter clock TX_Clk is overridden instead of overriding receive clock as shown in FIG. 6. Referring back to FIG. 7, in one embodiment, during calibration mode, Calib signal in the Transmitter causes Mux 702 to select Async_Clock as ClockT for Driver 701. In one embodiment, after calibration mode is over, Calib signal causes Mux 702 to select TX_Clk as ClockT for normal operation of Driver 701. In one embodiment, Driver 701 receives input data "in" and generates "Clk_Dcc" which is transmitted over TL1 to the Receiver. Here, "in" is the data to be transmitted. For calibration purposes, "in" is data with alternating pattern. For example, 0101 . . . etc.

At the Receiver, Tx_Out is received as Clk_Dcc_R signal which is sampled by Sampler 703a and Sampler 703b. In one embodiment, Sampler 703a and Sampler 703b are time-interleaved i.e., each receiver is sub-sampling the incoming Clk_Dcc_R at a lower rate. In one embodiment, for a two-way interleaved system, Sampler 703a uses rising edge of ClockR for sampling Clk_Dcc_R signal while Sampler 703b uses falling edge of ClockR for sampling Clk_Dcc_R. In another embodiment, multi-phase ClockR signal is used to sample Clk_Dcc_R such that one of the phases of ClockR is used by Sampler 703a for sampling Clk_Dcc_R while another one of the phases of ClockR is used by Sampler 703b for sampling Clk_Dcc_R.

In one embodiment, Pair-Wise XOR logic gate 704 at the Receiver is used to calibrate sampling phases of the Receiver clock ClockR by correlating samples Rx_Out (i.e., phases 0-N) from successive Samplers i.e., 703a and 703b. In such an embodiment, there will be (N+1) samplers—one corresponding to each phase 0-N. In one embodiment, Counter 705 counts the number of ones in the sampled signal. In one embodiment, Counter 705 is a ones counter. In one embodiment, the difference between the 1s' density at the different XOR outputs can be used to adjust ClockR (i.e., RX sampling phases).

In one embodiment, Multi-Phase Clock Generator 708 generates multiple phases of Clock1 (e.g., phases 1-4). In one embodiment, Phase Adjuster 707 receives input from CMP 706 to adjust phases of Clock1 to generate ClockR used by sampler(s) 703. In this embodiment, replica circuits are not used to calibrate Rx sampling phases. In one embodiment, there are multiple Pairwise XOR units and a corresponding counter coupled to the output of each of the multiple Pairwise XOR units. For example, for 'N' phases, there are 'N' counters. In one embodiment, CMP 706 compares the ones count between the corresponding counter outputs and drives Phase Adjuster 707 to equalize all these values. Here, when referring to the sampling phases as 0-N, there are (N−1) samples and (N+1) counters.

Figure 8:
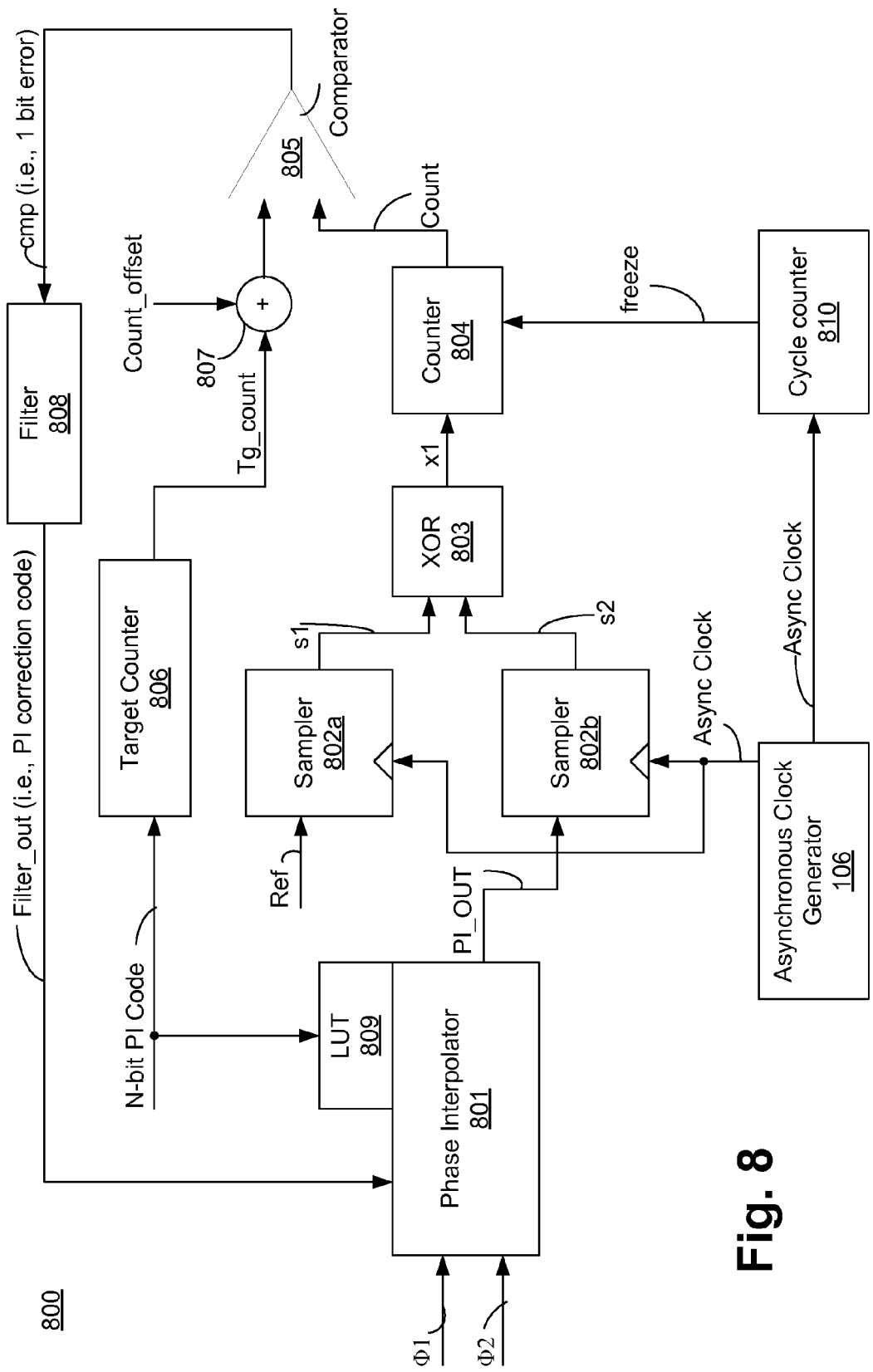
FIG. 8 illustrates a circuit for calibrating a phase interpolator, according to one embodiment of the disclosure.

FIG. 8 illustrates a Circuit 800 for calibrating a phase interpolator, according to one embodiment of the disclosure. It is pointed out that those elements of FIG. 8 having the same reference numbers (or names) as the elements of any other figure can operate or function in any manner similar to that described, but are not limited to such.

In one embodiment, Circuit 800 comprises Phase Interpolator (PI) 801, Samplers 802a and 802b, Exclusive OR (XOR) logic 803, Counter 804, Comparator 805, Target Counter or Register 806, phase adjuster (or summer) 807, Filter 808, Look-Up Table (LUT) 809, Cycle counter 810, and Asynchronous Clock Generator 106. In this embodiment, PI 801 output PI_OUT is calibrated and the rest of the circuit blocks are used for calibration.

In one embodiment, PI 801 receives input phases Φ1 and Φ2 and generates an interpolated output "PI_OUT" according to N-bit PI Code. In one embodiment, PI 801 can also be used as a clock phase rotator that interpolates between two input clock phases and generates an output phase "PI_OUT"

between the two clock phases. For example, output phase is rotated by controlling the strength of the two input clocks (Φ1 and Φ2) in an N-bit PI.

In one embodiment, Filter_Out signal is a PI correction code to calibrate PI_OUT. This PI_OUT is also used by other circuits (not shown). In one embodiment, Sampler 802*a* samples a reference clock (Ref) by Async_clock to generate sampled output "s1." In one embodiment, Sampler 802*b* samples PI_OUT with Async_Clock to generated sampled output "s2." In one embodiment, XOR 803 compares the sampled outputs "s1" and "s2" and generates an output x1. In one embodiment, Counter 804 receives input "x1" and counts a number of ones in signal "x1." In such an embodiment, Counter 804 is a ones counter as discussed in various other embodiments.

In one embodiment, output of Counter 804 is "Count" which is frozen (or held constant) by "freeze" signal from Cycle counter 810. In one embodiment, Cycle counter 810 operates using Async_Clock. In one embodiment, "Count" output from Counter 804 is compared with a target count "tg_count." In one embodiment, a "Count_offset" is added by summer 807 to "Tg_count" before comparing it with "Count" by comparator 805. In one embodiment, Target Counter 806 comprises a plurality of registers that store 'N' target counts that correspond to the 'N' target PI output phases. In one embodiment, output "cmp" of comparator 806 is filtered by Filter 808 to generate a PI correction code (i.e., "Filter_out"). In one embodiment, this correction code is provided to PI 901 to adjust "PI_OUT" (i.e., to calibrate "PI_OUT").

In one embodiment, phase of PI_OUT is measured with respect to a Ref signal. In one embodiment, Ref signal has the same frequency as PI input clock signals (Φ1 and Φ2). In one embodiment, the input clock of phase Φ1 is used as a Ref Clock. In other embodiments, other reference clock signals may be used. In one embodiment, at any PI code, once Cycle counter 810 reaches a target cycle count both Cycle Counter 810 and "ones" Counter 804 are frozen i.e., their outputs are held constant.

In one embodiment, by comparing the output Count of the "ones" Counter 804 with the target value tg_count, an error signal cmp is generated. In one embodiment, the error signal cmp is then low-pass filtered with Filter 808. In one embodiment, Filter 808 is a digital up/down counter which controls the PI correction code i.e., Filter_out. In one embodiment, once the error bit toggles (i.e., cmp signal switches), the optimum PI correction code is achieved and stored in LUT 809 for a given N-bit PI code. In one embodiment, the calibration process continues by sweeping through N-bit PI codes.

In one embodiment, at any PI code, the target counted "ones" for a given cycle counter can be calculated and stored in registers e.g., in registers of 806. Since the MSBs (most significant bits) of target "Ones" are equal to the N-bit PI code, in one embodiment, register 806 can be removed and MSBs of "ones" Counter 804 (i.e., MSBs of Count) are compared with the N-bit PI code. In such an embodiment, area and power of the calibration circuit can be reduced because Target Counter 806 is removed. In one embodiment, to account for non-zero phase between Ref and PI_OUT signals, the measured "ones" when PI code is set to zero is added to the target "ones" values (shown as a Count_offset). In such an embodiment, an (n+1) bit adder 807 is used. The embodiment, of FIG. 8 allows for an in-situ calibration of a PI 801 using fully digital calibration loop.

Figure 9:
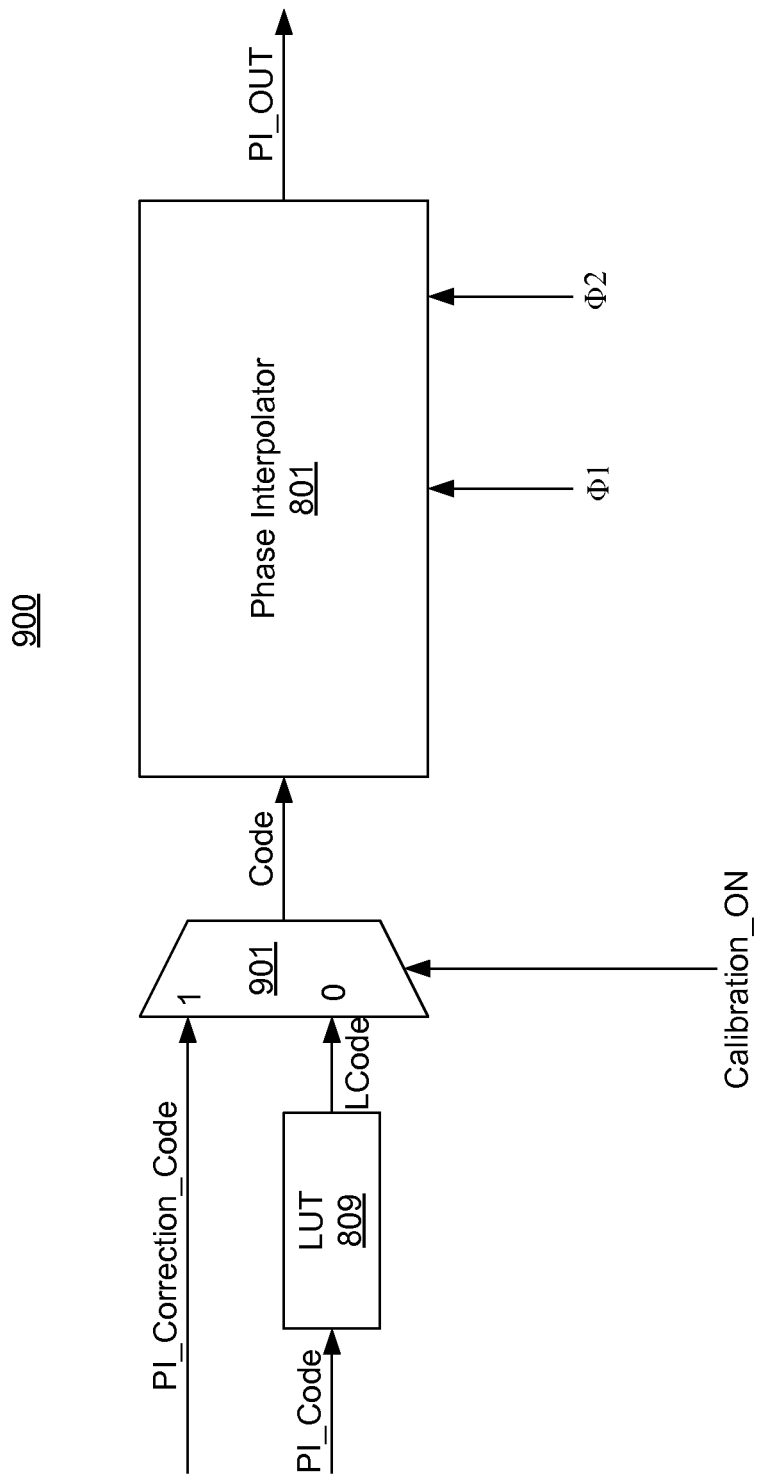
FIG. 9 illustrates a circuit for correcting the phase interpolator of FIG. 8, according to one embodiment of the disclosure.

FIG. 9 illustrates a Circuit 900 for correcting the phase interpolator of FIG. 8, according to one embodiment of the disclosure. It is pointed out that those elements of FIG. 9 having the same reference numbers (or names) as the elements of any other figure can operate or function in any manner similar to that described, but are not limited to such.

In this embodiment, a multiplexer 901 is shown that provides either the stored code LCode from LUT 809 or the PI_Correction_Code (i.e., Filter_out) to PI 801. For example, if calibration mode is on (i.e., when Calibration_ON signal is a high), PI_Correction_Code is provided to PI 801 else LCode is provided to PI 801.

In one embodiment, PI 801 is an M-bit PI (e.g., 9-bit PI), multiplexer 901 is an M-bit (e.g., 9-bit) input multiplexer, and LUT 809 is L×M bits (e.g., 128×9 bits) storage. In one embodiment, when PI calibration is turned on, the M-bit (e.g., 9-bit) PI is controlled with digital calibration loop which chooses the best equally-spaced phases out of the 512 possible output phases. Once the PI calibration is done, the optimum M-bit (e.g., 9-bit) control codes are written into LUT 809. This results in a N-bit (e.g., 7-bit) calibrated PI. During PI normal operation, the N-bit (e.g., 7-bit) phase code selects the corresponding M-bit (e.g., 9-bit) from LUT 809 to set the PI output phase PI_OUT.

Figure 10:
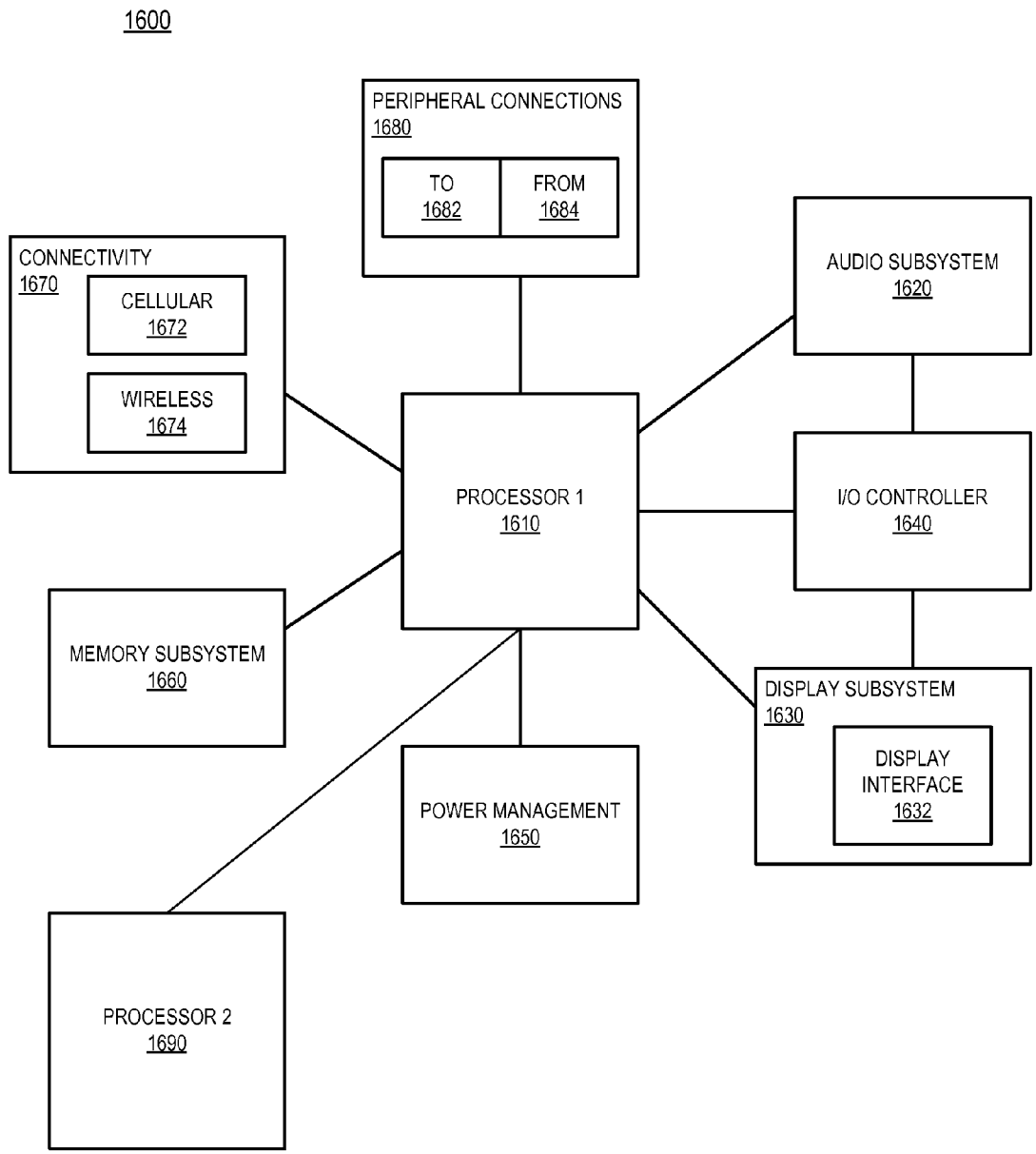
FIG. 10 is a smart device or a computer system or an SoC (system-on-chip) with calibrating apparatus, according to one embodiment of the disclosure.

FIG. 10 is a smart device or a computer system or an SoC (System-on-Chip) 1600 with calibrating apparatus, according to one embodiment of the disclosure. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with calibrating apparatus described with reference to embodiments discussed. Other blocks of the computing device 1600 may also include calibrating apparatus described with reference to embodiments. The various embodiments of the present disclosure may also comprise a network interface within 1670 such as a wireless interface so that a system embodiment may be incorporated into a wireless device, for example, cell phone or personal digital assistant or a wearable device.

In one embodiment, processor 1610 (and/or processor 1690) can include one or more physical devices, such as microprocessors, application processors, microcontrollers, programmable logic devices, or other processing means. Processor 1690 may be optional. While the embodiment shows two processors, a single or more than two processors may be used. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment an apparatus is provided which comprises: an asynchronous clock generator to generate an asynchronous clock signal; a digital sampler for sampling a signal using the asynchronous clock signal; a duty cycle corrector (DCC) to receive a differential input clock and to generate a differential output clock, wherein the digital sampler to sample at least one of an output clock from the differential output clock; and a counter to count output of the digital sampler and to provide a control to the DCC to adjust duty cycle of the differential output clock.

In one embodiment, the apparatus further comprises: a multiplexer to receive the differential output clock as input and to provide a selected output for the digital sampler. In one embodiment, the apparatus further comprises: a chopper to generate a select signal for the multiplexer according to the clock signal from the asynchronous clock generator. In one embodiment, the chopper is operable to select one of the output clock from the differential output clock. In one embodiment, the digital sampler comprises a D-Flip-Flop. In one embodiment, the counter is a ones' counter to count a number of logical ones in the sampled signal from the digital sampler. In one embodiment, the asynchronous clock generator comprises: a ring oscillator having a plurality of delay cells, each of which is a complex gate; a divider coupled to the ring oscillator; and a linear shift register coupled to the ring oscillator.

In another example, an apparatus is provided which comprises: a transmitter for coupling to a receiver via an interconnect, the transmitter including: a driver to drive a signal to the receiver; a duty cycle corrector (DCC) coupled to the driver, the DCC to correct duty cycle of the signal driven by the driver; a first sampler for sampling output of the driver; a first counter for counting samples from the first sampler, and to control the DCC to adjust the duty cycle of the signal which is driven to the receiver.

In one embodiment, the apparatus further comprises: an asynchronous clock generator to generate an asynchronous clock signal for the first sampler. In one embodiment, further comprises: a multiplexer to provide a selected input for the driver; and a chopper to generate a select signal for the multiplexer according to the asynchronous clock signal. In one embodiment, the first sampler comprises a D-Flip-Flop. In one embodiment, the receiver comprises: a second sampler to sample the signal driven by the driver of the transmitter; and a second counter to count a number of ones in the sampled driven signal. In one embodiment, the receiver further comprises: a multiplexer for providing an asynchronous clock to the second sampler. In one embodiment, the receiver further comprises an asynchronous clock generator to generate the asynchronous clock.

In another example, an apparatus is provided which comprises: an asynchronous clock generator to generate an asynchronous clock signal; a logic unit to receive at least two clock signals and to route the at least two clock signals in a sequence as output; a digital sampler to receive the output from the first logic unit, the digital sampler to sample the output using the asynchronous clock signal; and a counter to count a number of logical ones or zeros in the sampled output or a version of the sampled output, wherein the counter to count using the asynchronous clock signal.

In one embodiment, the logic unit comprises a multiplexer. In one embodiment, the apparatus further comprises a sequencer to sequence the at least two clock signals using the asynchronous clock signal. In one embodiment, the digital sampler comprises a D-Flip-Flop. In one embodiment, the apparatus further comprises a configurable logic to receive the sampled output and to provide a version of the sampled output to the counter.

In another example, a system is provided which comprises: a memory unit; a processor coupled to the memory unit, the processor having an apparatus according to the apparatus of the embodiments; and a wireless interface for allowing the processor to communicate with another device. In one embodiment, the system further comprises a display unit for displaying content processed by the processor. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an asynchronous clock generator to generate an asynchronous clock signal;
a digital sampler for sampling a signal using the asynchronous clock signal;
a duty cycle corrector (DCC) to receive a differential input clock and to generate a differential output clock, wherein the digital sampler is to sample at least one of an output clock from the differential output clock; and
a counter to count an output of the digital sampler and to provide a control to the DCC to adjust a duty cycle of the differential output clock, wherein the asynchronous clock signal is generated independently from the differential input clock.

2. The apparatus of claim 1 further comprises: a multiplexer to receive the differential output clock as input and to provide a selected output for the digital sampler.

3. The apparatus of claim 2 further comprises: a chopper to generate a select signal for the multiplexer according to the clock signal from the asynchronous clock generator.

4. The apparatus of claim 3, wherein the chopper is operable to select one of the output clock from the differential output clock.

5. The apparatus of claim 1, wherein the digital sampler comprises a D-Flip-Flop.

6. The apparatus of claim 1, wherein the counter is a ones' counter to count a number of logical ones in the sampled signal from the digital sampler.

7. The apparatus of claim 1, wherein the asynchronous clock generator comprises: a ring oscillator having a plurality of delay cells, each of which is a complex gate; a divider coupled to the ring oscillator; and a linear shift register coupled to the ring oscillator.

8. An apparatus comprising:
a transmitter for coupling to a receiver via an interconnect, the transmitter including:
a driver to drive a signal to the receiver;
a duty cycle corrector (DCC) coupled to the driver, the DCC to correct a duty cycle of the signal driven by the driver;
a first sampler for sampling output of the driver;
a first counter for counting samples from the first sampler, and to control the DCC to adjust a duty cycle of the signal which is driven to the receiver, and
an asynchronous clock generator to generate an asynchronous clock signal for the first sampler, wherein the asynchronous clock signal is generated independently from the signal.

9. The apparatus of claim 8 further comprises: a multiplexer to provide a selected input for the driver; and a chopper to generate a select signal for the multiplexer according to the asynchronous clock signal.

10. The apparatus of claim 8, wherein the first sampler comprises a D-Flip-Flop.

11. The apparatus of claim 8, wherein the receiver comprises: a second sampler to sample the signal driven by the driver of the transmitter; and a second counter to count a number of ones in the sampled driven signal.

12. The apparatus of claim 11, wherein the receiver further comprises: a multiplexer for providing an asynchronous clock to the second sampler.

13. The apparatus of claim 12, wherein the receiver further comprises an asynchronous clock generator to generate the asynchronous clock.

14. An apparatus comprising:
an asynchronous clock generator to generate an asynchronous clock signal;
a logic unit to receive at least two clock signals and to route the at least two clock signals in a sequence as an output;
a digital sampler to receive the output from the logic unit, the digital sampler to sample the output using the asynchronous clock signal; and
a counter to count a number of logical ones or zeros in the sampled output or a version of the sampled output, wherein the counter to count using the asynchronous clock signal,
wherein the asynchronous clock signal is generated independently from the at least two clock signals.

15. The apparatus of claim 14, wherein the logic unit comprises a multiplexer.

16. The apparatus of claim 14 further comprises: a sequencer to sequence the at least two clock signals using the asynchronous clock signal.

17. The apparatus of claim 14 further comprises: a configurable logic to receive the sampled output and to provide a version of the sampled output to the counter.

18. A system comprises: a memory unit; a processor coupled to the memory unit, the processor having an apparatus according to any one of apparatus claims 1 to 7; and a wireless interface for allowing the processor to communicate with another device.

19. The system of claim 18 further comprises a display unit for displaying content processed by the processor.

20. The system of claim 19, wherein the display unit is a touch screen.

21. A system comprises: a memory unit; a processor coupled to the memory unit, the processor having an apparatus according to any one of apparatus claims 8 to 13; and a wireless interface for allowing the processor to communicate with another device.

22. The system of claim 21 further comprises a display unit for displaying content processed by the processor.

* * * * *